United States Patent [19]

Geipel, Jr. et al.

[11] Patent Number: 4,527,325
[45] Date of Patent: Jul. 9, 1985

[54] PROCESS FOR FABRICATING SEMICONDUCTOR DEVICES UTILIZING A PROTECTIVE FILM DURING HIGH TEMPERATURE ANNEALING

[75] Inventors: Henry J. Geipel, Jr.; Charles A. Schaefer; Francis R. White, all of Essex Junction; John M. Wursthorn, Underhill Center, all of Vt.

[73] Assignee: International Business Machines Corporation, Armonk, N.Y.

[21] Appl. No.: 564,880

[22] Filed: Dec. 23, 1983

[51] Int. Cl.³ .............. H01L 21/265; H01L 21/31
[52] U.S. Cl. ............................ 29/571; 29/578; 148/1.5; 148/174; 148/186; 357/42; 357/59; 156/653; 156/659.1
[58] Field of Search ............... 29/571, 578, 576 B; 148/1.5, 186, 174, 175; 357/23, 42, 44, 59; 156/652, 653, 659.1

[56] References Cited

U.S. PATENT DOCUMENTS

| | | | |
|---|---|---|---|
| 3,920,481 | 11/1975 | Hu | 29/571 X |
| 3,921,283 | 11/1975 | Shappir | 29/571 |
| 3,999,213 | 12/1976 | Brandt et al. | 29/571 X |
| 4,214,917 | 7/1980 | Clark et al. | 29/571 X |
| 4,240,845 | 12/1980 | Esch et al. | 29/571 X |
| 4,363,868 | 12/1982 | Takasaki et al. | 156/653 X |
| 4,398,338 | 8/1983 | Tickle et al. | 29/571 |
| 4,412,375 | 11/1983 | Matthews | 29/571 |

*Primary Examiner*—Brian E. Hearn
*Assistant Examiner*—David A. Hey
*Attorney, Agent, or Firm*—Mark F. Chadurjian; George Tacticos

[57] ABSTRACT

A process is provided for fabricating a semiconductor structure wherein the structure has to be exposed to certain oxidizing conditions during certain of its processing steps, such as its high temperature annealing in an oxidizing ambient. It includes depositing a "sacrificial" layer, such as silicon, to provide a uniformly oxidizing surface during subsequent annealing operations. This sacrificial layer, which oxidizes uniformly, produces an oxide layer which also etches uniformly. Thus, after the annealing is completed, the surface oxide is removed through etching and the sacrificial layer is then also removed through a different etching step.

7 Claims, 5 Drawing Figures

PROCESS FOR FABRICATING SEMICONDUCTOR DEVICES UTILIZING A PROTECTIVE FILM DURING HIGH TEMPERATURE ANNEALING

DESCRIPTION

1. Technical Field

This invention relates to processes for making integrated semiconductor structures and more particular to processes that use high temperature annealing in an oxidizing ambient.

2. Related Applications

In copending U.S. patent application Ser. No. 448,124, now U.S. Pat. No. 4,480,375, filed on Dec. 9, 1982, and entitled "A Simple Process for Making Complementary Transistors" and copending U.S. patent application Ser. No. 448,125, now U.S. Pat. No. 4,470,191, also filed on Dec. 9, 1982 and entitled "Process for Making Complementary Transistors", both assigned to the present assignee, there are disclosed and claimed novel processes for making Complementary Metal Oxide Semiconductor (CMOS) Structures.

BACKGROUND ART

In the manufacture of semiconductor structures it is often necessary to subject the structures to high temperature annealing. For example, a high temperature annealing step is often necessary to drive into a substrate dopants disposed close to a surface portion of the substrate and to establish the desired depth of the doped region. In many such processes this high temperature treatment takes place in a dry or steam oxidizing ambient in order to avoid the problems associated with the accidental presence of small amounts of oxygen in the annealing chamber (caused either from room air pressure leaks into the annealing chamber or caused from its presence as an impurity in the inert gas introduced into the chamber) which can produce the normally volatile SiO. However, unless oxidation prevention layers are formed over all oxidizable parts of the structure, many portions of the structure will be oxidized and will require etching to remove the unwanted oxides. Furthermore, depending on the type of materials exposed to oxidation and the degree to which the materials are protected from oxidation, some regions may be oxidized faster than others forming oxide layers with different thicknesses. For example, a silicon layer exposed to a high temperature oxidizing ambient will oxidize faster than another silicon layer which is already covered by a thin silicon dioxide layer. This makes the removal of the new silicon dioxide layer difficult because the same etching solution will remove new and old silicon dioxide material at the same rate. In some cases this may result in the overetching of underlying oxide layers which may in turn cause damage to the underlying structures.

THE INVENTION

In accordance with the teachings of the present invention a process is provided for use in the fabrication of semiconductor structures. The process includes covering a structure with a uniformly oxidizing layer prior to subjecting the structure to a high temperature oxidizing ambient. This uniformly oxidizing layer, which can be viewed as a "sacrificial layer," will be oxidized, at least in part, to form an oxide of uniform thickness on its exposed surface. Since both the oxidized and unoxidized portions of this sacrificial layer will have uniform thickness, they can be removed at the appropriate time using separate etching steps.

The foregoing and other features and advantages of the invention will be apparent from the following and more particular description of the preferred embodiments of the invention, as illustrated in the accompanying drawings.

BEST MODE FOR CARRYING OUT THE INVENTION

Figure 1:
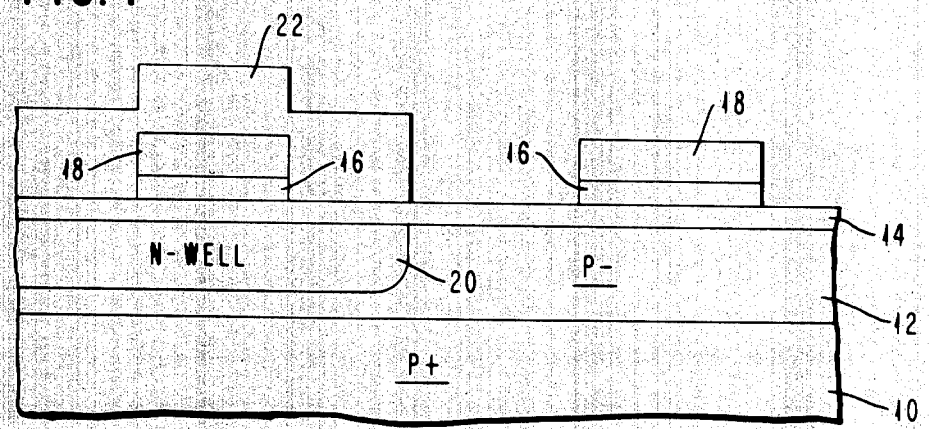
FIGS. 1–4 are sectional views of a semiconductor structure successively illustrating important steps in the process of fabricating such a structure in accordance with the teachings of the present invention.

One application of this process is in the fabrication of complementary Field Effect Transistor (CFET) devices. Referring now to the drawings in more detail, there is shown in FIG. 1, a sectional view of a CFET device during an early stage of the fabrication thereof. This structure includes a semiconductor substrate 10, which is made of a P+ type conductivity silicon and an epitaxial silicon layer 12 with a P− conductivity, typically having a thickness between 1 and 15 micrometers ($\mu$m) and a resistivity between 5 and 50 ohm-cm formed on substrate 10. A thin layer of silicon dioxide 14, which is often referred to as "pad oxide" is grown or deposited on the epitaxial layer 12 and a layer of silicon nitride 16 is deposited by conventional low pressure chemical vapor deposition techniques, on the silicon dioxide layer 14. Layers 14 and 16 have typically thicknesses about 40 and 100 nanometers (nm) respectively. A first layer 18 of polycrystalline silicon ("polysilicon"), having a thickness of about 150 nanometers (nm) is deposited on the silicon nitride layer 16 by conventional techniques, such as, for example, a low pressure chemical vapor deposition. Using conventional photoresist masking techniques areas are defined on the first polysilicon layer where field oxide should not be formed and protected during an etching operation that removes the remaining portions of the first polysilicon layer and the underlying portions of the nitride layer. This etching operation may be accomplished using dry etching techniques, such as, for example, using carbon tetrafluoride ($CF_4$) and oxygen ($O_2$) gas. The photoresist mask is then stripped in an oxygen plasma and the surface of the structure is cleaned. A new photoresist mask is then formed to define the position of the N-well region 20 and for use as an ion implantation mask for implementing an N-type dopant material (such as phosphorus) over the defined N-well region 20. A heat resistant material which is not incompatible with the other materials of the structure, such as silicon, is evaporated to form a layer over the structure and the photoresist mask with the excess silicon on it is then lifted-off. The silicon layer 22 may be formed from polysilicon material which is usually amorphous as desired. The deposited resulted structure is such as that shown in FIG. 1.

Many of the above mentioned early steps for the fabrication of CFET devices are also discussed in copending related U.S. patent application Ser. No. 448,124 and Ser. No. 448,125 referred to earlier in the specification.

Figure 2:
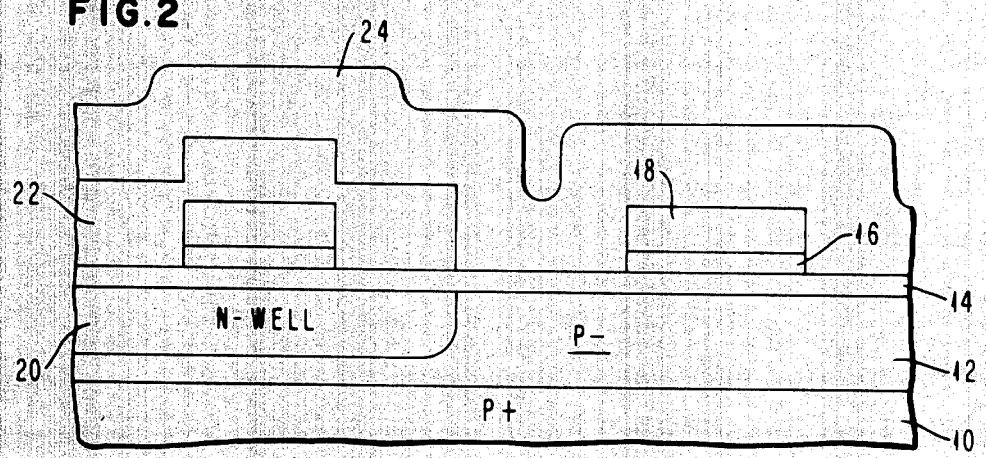
Figure 3:
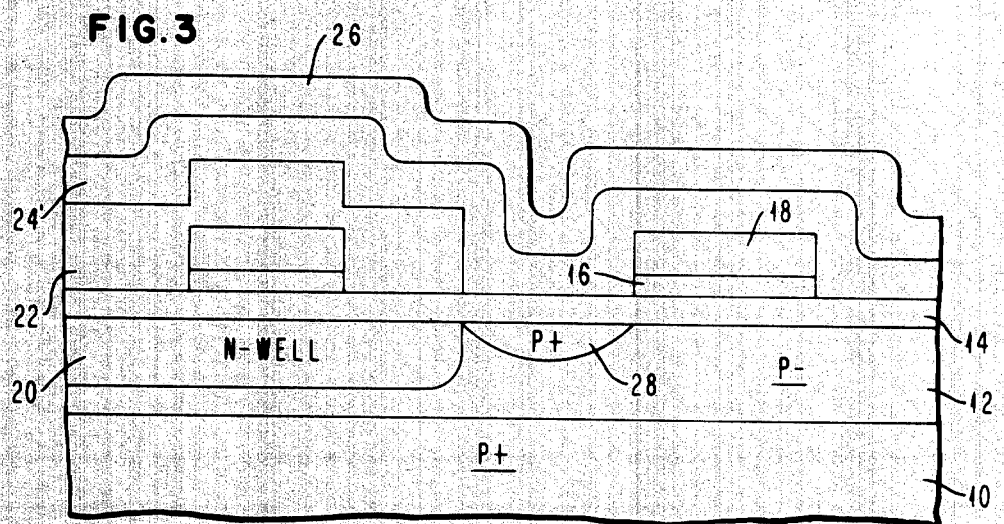
Figure 4:
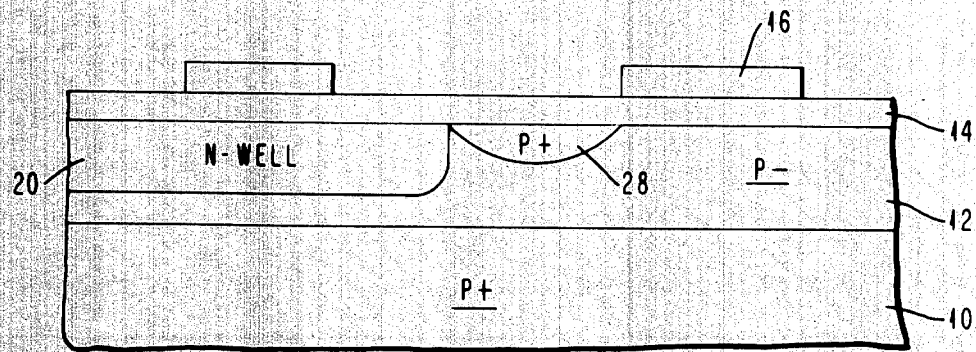

Referring now to FIG. 2, there is shown the structure of FIG. 1, covered with a protective "sacrificial" layer 24 to prevent the oxidation of the underlying materials during a high temperature anneal in an oxidizing ambient. The high temperature anneal is often necessary in order to drive-in the N-dopants of the N-well region to a predetermined depth within this region and to thus define the depth of the N-well region 2. The material selected for this sacrificial layer must be a material that can withstand a high temperature oxidizing environment in a temperature ranging between 900° and 1300° C., and it must be of a type that oxidizes uniformly and both its oxide and its unoxidized portion can be removed with the processes and chemicals that are commonly used in the semiconductor technology. The sacrificial layer 24 must be thick enough so that it does not oxidize in its entirety, during the high temperature annealing and thin enough to permit ion implantation through it for the doping of the field isolation regions. For example silicon or silicon nitride ($Si_3N_4$) can be used for this application. In one example a silicon layer of about 300 Å was deposited on the structure using conventional Low Pressure Chemical Vapor Deposition (LPCVD) techniques. During the drive-in anneal a portion of this layer was oxidized as shown in FIG. 3. Layer 26 is the silicon dioxide layer formed on the "sacrificial" layer 24. The thickness of layer 24 was selected so that following the oxidation a portion 24' of the silicon layer remains unoxidized. The structure of FIG. 3 was then subjected to an ion implantation step for the creation of the N-channel device field isolation regions 28 using the type of ions that are used to form P type conductivity regions, such as boron. The $SiO_2$ layer 26 is then removed using chemical etching in a buffered HF solution and the remaining sacrificial layer 24', plus the masking layer 22 and the polysilicon layer 18 over the active device regions are removed through chemical etching in a solution containing 7 parts nitric acid ($HNO_3$) to 4 parts water and to 1 part of buffered hydrofluoric acid (HF). The structure is then as shown in FIG. 4.

One advantage of this invention is that it provides for a sacrificial layer, such as silicon, over the entire structure including the portion of the pad oxide 14 over the field isolation region 28. Without the sacrificial layer 24' the portion of pad oxide 14 over the field isolation region 28 could be partially or totally removed during the removal through etching of $SiO_2$ layer 26.

Furthermore, without the use of sacrificial layer 24 as shown in FIG. 2, the silicon masking layer 22 will be oxidized during the high temperature anneal at a faster rate than the silicon under the pad oxide 14 over the field isolation region. Thus during the removal of this oxide over the masking layer the pad oxide will also be etched and in some cases it may even be removed in its entirety ("punched-through") in this region which in turn will expose the underlying silicon of region 28 to the etching solutions used to remove silicon layer 22 and it would thus be etched away. The present invention prevents this from happening by protecting with layer 24' the pad oxide 14 from etching during the removal of oxide layer 26.

If instead of silicon (Si), a silicon nitride ($Si_3N_4$) layer is used for the sacrificial layer 24, then during oxidation a silicon-oxynitride (Si—O—N) layer 26 will be formed thereon.

Figure 5:
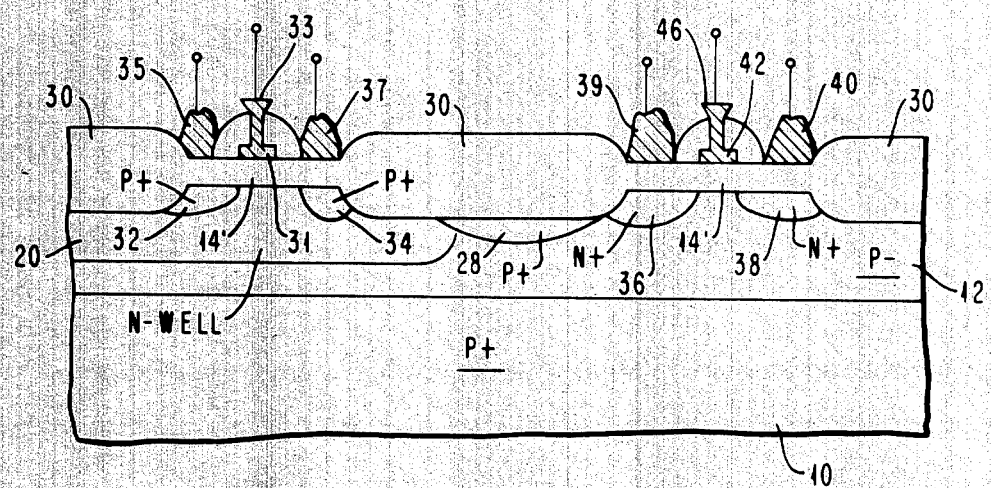
FIG. 5 is a cross-sectional view diagrammatically illustrating a structure construed with a process incorporating teachings of the present invention.

Following the formation of the N-well region and the active device regions self-aligned to the field regions, the fabrication of the CFET structure of this embodiment as shown in FIG. 5 is then completed through formation on the structure of field oxide regions 30, gate electrodes 31 and 42, P-type source and drain regions 32 and 34 for the P-channel FET and N-type source and drain regions 36 and 38 for the N-channel FET using conventional semiconductor processing techniques, similar to some of the techniques referred to in U.S. patent application Ser. No. 448,124 and Ser. No. 448,125 referred to above. For example, using the nitride portions 16 shown in FIG. 4, as an oxidation mask to prevent the further oxidation of the active regions of the device, the field oxide regions are formed through an oxidation of the remaining portion of the substrate. The gate structures are then formed for both the N-channel and P-channel FET's through the deposition and etching of a suitable conductive material. Source 32 and drain 4 regions for the P-channel FET are formed while the other active region is masked. This mask is then removed and a new mask is formed on the P-channel FET and the source 36 and drain 38 regions of the N-channel FET are formed. An appropriate passivating layer, such as for example a phosphosilicate glass may be provided over the surface of the active regions and contact holes are defined and opened with the use of an additional mask. A metal layer is then deposited over the openings and etched so as to form contacts such as gate electrode contacts 33 and 46, electrode contacts 35 and 39 for source regions 32 and 36 respectively and electrode contacts 27 and 40 for drain regions 34 and 38 respectively.

While the invention has been described in the above embodiment in connection with processes used to fabricate CFET structures having an N-type region on a P-type epitaxial layer the process can equally be used to make CFET structures having P-type wells or formed on an N-type epitaxial layer and in the fabrication of other than CFET structures. Thus, it should be understood that the invention is not to be limited to these particular process steps, their sequence, or the final structures depicted in the drawings. On the contrary, it is intended to cover all alternatives, modifications and equivalents, as may be included within the spirit and scope of the invention as defined in the appended claims.

What is claimed is:

1. A process of fabricating a semiconductor structure wherein said structure has to be exposed to oxidizing conditions during certain processing steps and wherein said structure includes regions which react differently in the presence of such oxidizing conditions, comprising:

covering said structure with a sacrificial layer of a material which oxidizes uniformly under said oxidizing conditions;

exposing said structure to said oxidizing conditions to thereby cause formation of an oxide layer only on said sacrificial layer; and completely removing said oxide layer and thereafter completely removing said sacrificial layer.

2. A process as set forth in claim 1 wherein said sacrificial layer is a layer of silicon and said oxide layer is a layer of silicon dioxide.

3. A process as set forth in claim 2 wherein said oxidizing conditions only partially convert said silicon layer into silicon dioxide.

4. A process as set forth in claim 1 wherein said sacrificial layer is a layer of silicon nitride and said oxide layer is a layer of silicon oxynitride.

5. In a process of fabricating a semiconductor structure wherein said structure has to be exposed to oxidizing conditions during certain processing steps and wherein different portions of said structure are oxidizing at different rates making it difficult to remove the oxidized portions without affecting the underlying materials, the improvement comprising:
   covering said structure with a sacrificial layer of an oxidizing material having a predetermined thickness so that a surface portion of said material will be oxidized by said oxidizing conditions occurring during said processing steps;
   exposing said structure to said oxidizing conditions during said processing steps to thereby convert said surface portion of said sacrificial layer of oxidizing material into its equivalent oxide and said sacrificial layer prohibiting formation of an oxide layer elsewhere on said structure;
   removing said oxidized surface portion after the completion of said processing steps which expose said structure to said oxidizing conditions; and
   removing the unoxidized portion of said sacrificial layer of oxidizing material.

6. In a process for fabricating an integrated CFET structure having P and N channel active devices in a single semiconductor layer of a first conductivity type, wherein one of said active devices is formed in well region having a conductivity opposite to that of said semiconductor layer, wherein electrical isolation is provided by field oxide regions located between said devices and by field isolation implant regions located under portions of some of said field oxide regions, the improvement which comprises:
   covering said structure with a sacrificial layer of an oxidizing material following an ion implantation step for the doping of said well region and preceding a high temperature annealing step for establishing the junction depth of said well region through thermal diffusion;
   exposing said structure to said high temperature annealing step for a predetermined period of a time in an oxidizing ambient, causing thereby a portion of said sacrificial layer to be oxidized and said sacrificial layer prohibiting formation of an oxide layer elsewhere on said structure;
   removing said oxidized portion of said sacrificial layer following the completion of said annealing step; and
   removing any unoxidized portion of said sacrificial layer.

7. In a process for fabricating an integrated CFET structure having P and N channel active devices in a single semiconductor layer of a first conductivity type, wherein one of said active devices is formed in a well region having a conductivity opposite to that of said semiconductor layer, wherein the formation of said well region takes place in an oxidizing ambient and wherein said structure includes on it exposed regions having different oxidizing characteristics, the improvement which comprises:
   covering said structure with a sacrificial layer of an oxidizing material prior to an annealing step in an oxidizing ambient for the establishment of a preselected junction depth in said well region through thermal diffusion;
   exposing said structure to said annealing step for a predetermined period of time in an oxidizing ambient, causing thereby only said sacrificial layer to be oxidized;
   removing an oxidized portion of said sacrificial layer following the completion of said annealing step; and
   removing any remaining portion of said sacrificial layer.

* * * * *